United States Patent [19]

Plies et al.

[11] Patent Number: 4,540,885

[45] Date of Patent: Sep. 10, 1985

[54] SPECTROMETER OBJECTIVE HAVING PARALLEL OBJECTIVE FIELDS AND SPECTROMETER FIELDS FOR THE POTENTIAL MEASURING TECHNIQUE

[75] Inventors: Erich Plies, Munich; Reinhard Weyl, Assling; Burkhard Lischke, Munich, all of Fed. Rep. of Germany

[73] Assignee: Siemens Aktiengesellschaft, Berlin & Munich, Fed. Rep. of Germany

[21] Appl. No.: 513,762

[22] Filed: Jul. 14, 1983

[30] Foreign Application Priority Data

Sep. 30, 1982 [DE] Fed. Rep. of Germany ....... 3236273

[51] Int. Cl.³ .......................................... H01J 49/44
[52] U.S. Cl. .................................. 250/310; 250/305; 250/396 ML
[58] Field of Search ........... 250/396 R, 396 ML, 397, 250/399, 305, 310

[56] References Cited

U.S. PATENT DOCUMENTS

| | | | |
|---|---|---|---|
| 3,870,891 | 3/1975 | Mulvey | 250/398 |
| 4,315,152 | 2/1982 | Smith | 250/396 ML |
| 4,442,335 | 4/1984 | Tamura et al. | 250/310 |
| 4,464,571 | 7/1984 | Plies | 250/305 |

FOREIGN PATENT DOCUMENTS 45-6639 6/1970 Japan ................................. 250/310

OTHER PUBLICATIONS

"Mini Lenses and the SEM," T. Mulvey, Scanning Electron Microscopy, Apr. 1974, pp. 43–50.
"VLSI Testing Using the Electron Probe" by H. P. Feuerbaum, Scanning Electron Microscopy/1979/I SEM Inc., AMF O'Hare, IL, pp. 285–296.

Primary Examiner—Alfred E. Smith
Assistant Examiner—Paul A. Guss
Attorney, Agent, or Firm—Hill, Van Santen, Steadman & Simpson

[57] ABSTRACT

An apparatus for the potential measuring technique has an objective lens for focusing primary electrons onto an object, and also has a spectrometer for the energy selection of secondary electrons to provide an improvement of the quantitative potential measurement on printed conductors of integrated microelectronic components with improved local resolution, higher probe current, and improved potential resolution. The objective lens is a magnetic lens in which the lens field lies largely outside the lens body, and the spectrometer is an electrostatic retarding field spectrometer arranged in the magnetic field of the lens.

11 Claims, 5 Drawing Figures

SPECTROMETER OBJECTIVE HAVING PARALLEL OBJECTIVE FIELDS AND SPECTROMETER FIELDS FOR THE POTENTIAL MEASURING TECHNIQUE

BACKGROUND OF THE INVENTION

The invention relates to an apparatus involving the potential measuring technique, and comprising an objective lens for focusing of primary electrons onto an object, and further comprising a spectrometer for the energy selection of secondary electrons.

Up until now, in commercial scanning electron microscopes, an electrostatic spectrometer for quantitative potential measurements was installed between the last lens (objective) and the target (H. P. Feuerbaum, Scanning Electron Microscopy/1979/I, 285–296 and U.S. Pat. Nos. 4,277,679 and 4,292,519), incorporated herein by reference. A spectrometer for the quantitative potential measurement requires a minimum working distance which prevents a reduction of the objective-focal length and hence a reduction of the lens aberrations.

SUMMARY OF THE INVENTION

An object of the present invention is to provide an apparatus of the above described type which permits an improvement of the quantitative potential measurement of printed conductors of integrated microelectronic components with an improved local resolution, higher probe current, and an improved potential resolution.

In accordance with the invention this objective is achieved by providing the objective lens as a magnetic lens in which a magnetic field overlies permanently outside a body of the lens. The spectrometer comprises an electrostatic retarding field spectrometer arranged in the magnetic field of the lens. The invention permits a compact novel spectrometer objective (objective with integrated spectrometer) with which a small current-intense primary electron probe, and hence a high local resolution can be obtained. A spectrometer objective according to the invention also guarantees a virtually angle-independent detection of the secondary electrons and hence an improved potential resolution. This improved efficiency is achieved through the following individual techniques:

(a) The objective lens is a "stray field lens" in which the magnetic lens field lies largely outside the lens body. Thus the demands for a small focal length, small axial lens aberrations, and space for the spectrometer can be simultaneously met.

(b) The electrostatic retarding field-spectrometer is arranged rotationally symmetrically and in the magnetic field of the "stray field lens" so that its electric field is spatially superimposed on the magnetic lens field.

(c) The spectrometer electrodes are so formed that, between a specimen and a retarding field grid of the spectrometer, the electric field E of the spectrometer is parallel or anti-parallel to the magnetic flow density B of the "stray field lens"; i.e., the following equation must be valid: $E = cB$ with $c$ being a scalar quantity and $c > 0$ or $c < 0$.

(d) Through an embodiment according to the invention of the spectrometer the secondary electrons are shielded or screened from harmful external electrostatic surrounding fields.

The "stray field lens" or "snorkel lens" was first proposed by T. Mulvey, U.S. Pat. No. 3,870,891, incorporated herein by reference, for X-ray microanalysis. Through the spatial superimposition of E-field and B-field in the case of an apparatus according to this invention, both fields act on the primary electrons; i.e., in the case of the primary electron probe generation, as well as on the secondary electrons in the case of the potential measurement. An apparatus according to the invention has double-function fields for the primary and secondary ray.

With the invention, electric potential surfaces are perpendicular to the B lines of flux. This is favorable for the detection of the secondary electrons. If electric potential surfaces are perpendicular to B lines of flux, the $\vec{E} \times \vec{B}$-drift for the electron movement disappears. This movement would otherwise allow the electrons to drift off with the drift speed $\vec{v}_D = \vec{E} \times \vec{B} / |\vec{B}|^2$ perpendicularly to the E-field as well as to the B-field. If one disregards the drift still remaining, but smaller by an order of magnitude, this drift which is due to inertia effects and flux line curvature effects permits the secondary electrons to only execute a gyration movement. Thus the secondary electrons describe Larmor circles whose center (the guidance center) migrates along the B line of flux to the counterfield electrode of the spectrometer and strikes the retarding field electrode approximately perpendicularly. One thus obtains an approximately angle-independent detection of the secondary electrons for all start points of secondary electrons on the specimen.

DESCRIPTION OF THE PREFERRED EMBODIMENTS

Figure 1:
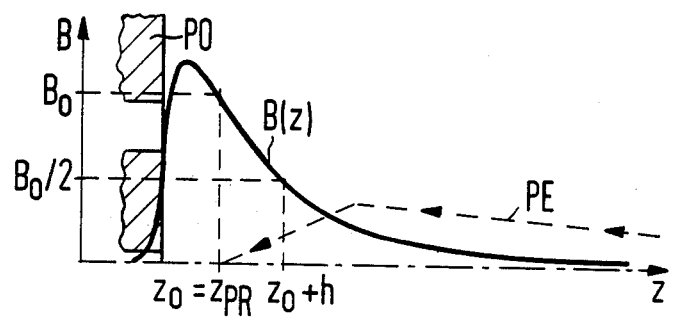
FIG. 1 shows an axial field distribution of a "snorkel-line" stray field lens.

FIG. 1 shows the axial field distribution B(z) of a "snorkel lens" such as has been described for example in the above-cited Letters Patent of Mulvey. This "snorkel lens" possesses pole shoes PO from which the magnetic field B(z,r) emerges. On the basis of the drawing it is demonstrated how, from a measured axial field distribution B(z) of a "stray field lens", one determines the form of collector electrode AE and retarding field electrode GE of a spectrometer detection objective according to the invention so that the flux E-lines run approximately parallel, or anti-parallel, respectively, to the flux B-lines.

Figure 3:
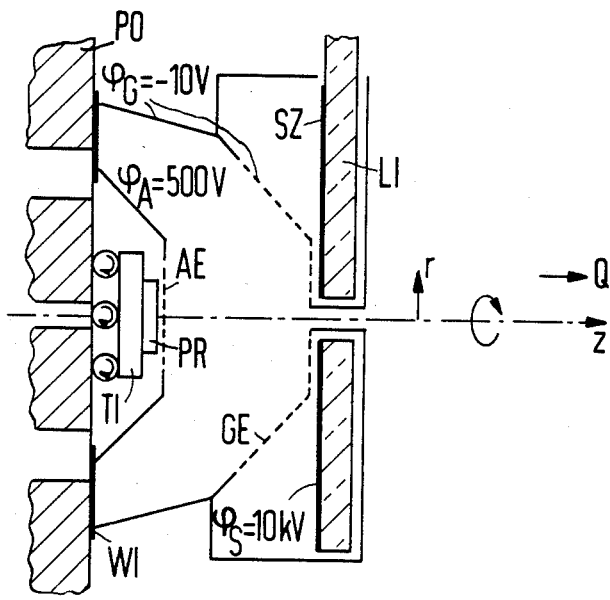
FIGS. 3 through 5 show spectrometer objectives according to the invention.
Figure 4:
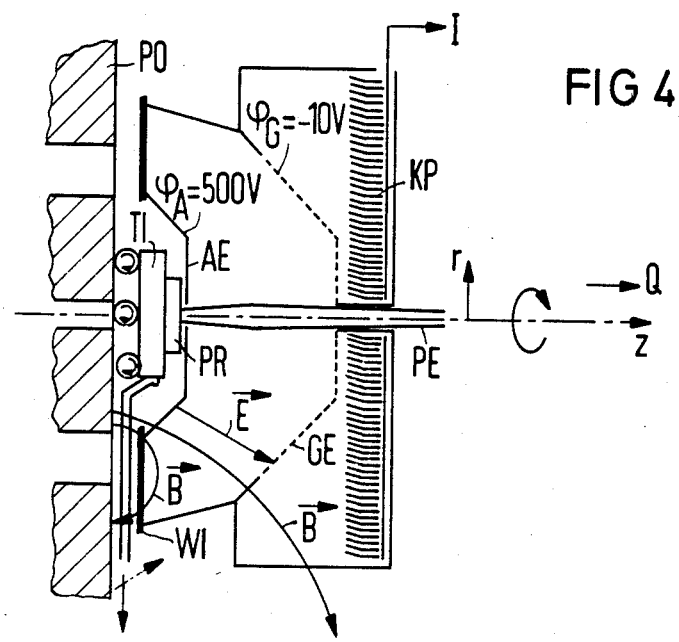
Figure 5:
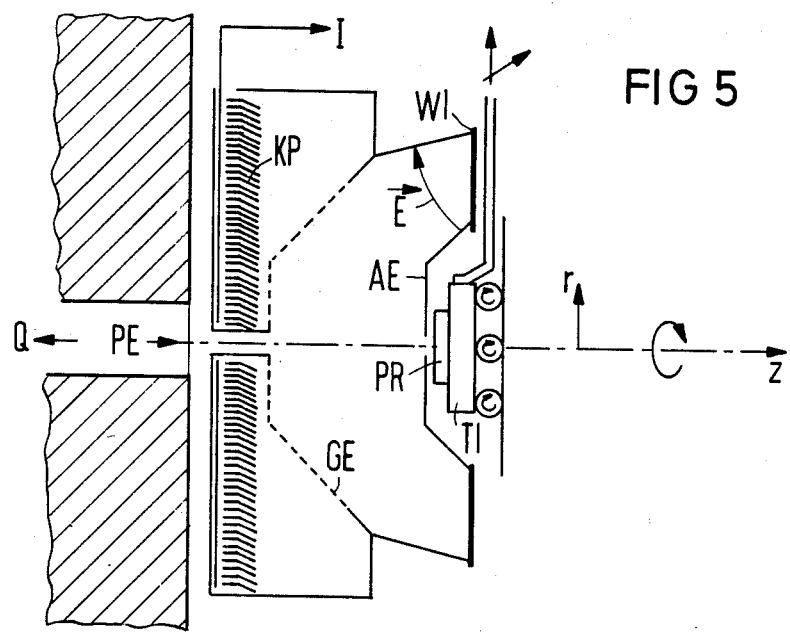

FIGS. 3, 4 and 5, show three different embodiments of a spectrometer objective according to the invention. In FIGS. 3 and 4 the primary ray PE comes from the field side of the snorkel lens, whereas the primary ray in FIG. 5 is incident from the ferromagnetic circuit side of the snorkel lens. In FIG. 3 the detector is a scintillator SZ with light guide conductor LI. The collector electrode AE is grid-shaped in FIG. 3 in the proximity of the specimen PR, and the ends of the collector electrode AE attach to the pole shoes PO of the snorkel lens via a resistance layer WI and an insulator not illustrated in the Figure. In the sample embodiments according to FIGS. 4 and 5, a channel plate KP is selected as a detector. The collector electrode AE, in the sample embodiments according to FIG. 4 and FIG. 5, has in the proximity of the specimen PR a pinhole or aperture diaphragm, and the spectrometer, in the sample embodiments according to FIG. 4 and FIG. 5, does not attach with its resistance layer WI to the pole shoes.

Hereafter it shall be shown that from the measured axial field distribution B(z) of a snorkel lens according to FIG. 1, the position and the form of the spectrometer-electrodes AE, GE, can be determined so that the lines of flux of the E-field as well as of the B-field in the spectrometer objective are approximately parallel, or anti-parallel, respectively. The snorkel lens was selected because, as is known, it possesses small axial aberrations or image defects.

FIG. 1 shows the field side of the snorkel lens with the pole shoes PO with a measured axial field distribution $B(z) = B_z(z,o)$. As is apparent from FIG. 1, the measuring curve B(z) for z-values greater than $z_o$ can very well be approximated through exponential function. If, in FIG. 1, the primary electrons PE come from the right and if the probe lies at z-values greater than $z_o = z_{PR}$, whereby the specimen PR is arranged at $z_{PR}$, then an exponential curve fitted for a calculation according to the invention of the electrostatic potential for the spectrometer can be employed.

The measured axial field distribution of the snorkel lens is assumed to have the value $B_o$ at $z_o$ and the value $B_o/2$ at $z_o + h$. In an experiment, for example, a snorkel lens with the values $B_o$:400 Gauss, $z_o$:12.5 mm, and h:13 mm was employed.

The fact that the E-field is parallel, or anti-parallel, respectively, to the B-field can be expressed mathematically as follows:

$$\vec{E}(z, r) = C_1 \cdot \vec{B}(z, r) \tag{1}$$

The condition of equation (1) must also apply on the optical axis (r=0) where, on account of the assumed rotational symmetry, only the z-component of the fields is different from zero:

$$E_z(z, o) = C_1 \cdot B_z(z, o) \tag{2}$$

If one designates the electrostatic potential in the space with $\phi(z, r)$ and if one designates the potential on the optical axis with $\phi(z) = \phi(z, o)$, then on account of $B_z(z,o) = B(z)$, there results from equation (2):

$$-\delta\phi(z)/\delta z = C_1 \cdot B(z) \tag{3}$$

Through integration one obtains from equation (3) the axial potential:

$$\phi(z) = -C_1 \int B(z)dz + C_2 \tag{4}$$

with the integration constant being $C_2$. However, if in the case of rotational symmetry, one knows the potential $\phi(z)$ on the optical axis, then it is possible to calculate the potential $\phi(z, r)$ with the known formula $$\phi(z, r) = \frac{1}{2\pi} \int_0^{2\pi} \phi(z + i r \sin \alpha) d\alpha \tag{5}$$

in the entire space. In equation (5) i is the imaginary unit.

For the fit function of the experimentally measured axial field distribution B(z) according to FIG. 1:

$$B(z) = B_0 \exp[-(z-z_0) \ln 2/h]x \tag{6}$$

from FIG. 1 the two integrations in the equations (4) and in (5) can be immediately carried out and one obtains:

$$\phi(z, r) = C_1 \cdot B_0 \cdot a \cdot \exp\left(-\frac{z - z_0}{a}\right) J_0\left(\frac{r}{a}\right) + C_2 \tag{7}$$

with $a = h/\ln 2$.

Thus in equation (7) $J_o$ is the Bessel function of zero-order and of the first kind. For the calculation of the equipotential surfaces one solves equation (7) for z:

$$z = z_0 + a \ln\left[\frac{C_1 B_0 a}{\phi - C_2} J_0\left(\frac{r}{a}\right)\right] \tag{8}$$

With equation (8) the equipotential surfaces for the electrodes AE, GE in the sample embodiments according to FIGS. 3 and 4 were calculated with $z_{PR} = z_0$. For the inventive spectrometer arrangements according to FIG. 3 and FIG. 4 these equipotential surfaces were replaced piece by piece by planes and truncated cone-generated surfaces.

In the spectrometer objective according to FIG. 3 the retarding field grid GE must be sufficiently finely meshed and sufficiently removed from the scintillator SZ in order that the voltage of 10 kV connected to the scintillator SZ will not penetrate the retarding field grid GE.

The primary electron beam PE can, in a simple fashion, be scanned or sampled over the specimen PR if a two-stage beam deflection system is employed and, with the spectrometer objectives according to FIG. 3 and FIG. 4, if the sweep point or pivot point of the primary electron beam scanning is placed in the primary ray-entry hole or aperture in the retarding field grid GE. This is also possible if a primary plane of the objective for the primary ray scanning lies between the retarding field grid GE and the source Q of the primary electrons PE.

Figure 2:
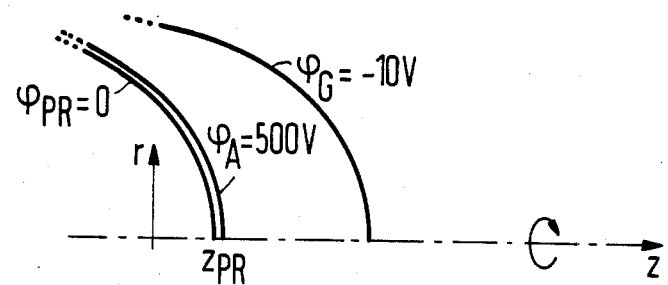
FIG. 2 shows electric equipotential surfaces for which the vectorial product of the E-field and the B-field according to FIG. 1 disappears.

In the sample embodiments according to FIG. 3, with FIG. 5 the following potentials were selected: The specimen PR is to be at the potential $\phi_{PR} = 0$, the collector electrode AE is to be at a potential $\phi_A = 500$ V, the retarding field electrode GE finally is to be at a potential $\phi_G = -10$ V (see FIG. 2). In FIG. 4 it is demonstrated that the lines of flux of the E-field and of the B-field in the spectrometer range run approximately parallel, or anti-parallel, respectively, to one another. In FIG. 4, moreover, the boundary and focusing of the primary electrons PE is illustrated. In the sample embodiments according to FIG. 4 and FIG. 5 the specimen PR is positioned on a table TI displaceable in the plane perpendicularly to the optical axis. The axially bored-through channel plate KP according to FIGS. 4 and 5 delivers the detector current I.

Although various minor changes and modifications might by proposed by those skilled in the art, it will be understood that we wish to include within the claims of the patent warranted hereon all such changes and modifications as reasonably come within our contribution to the art.

We claim as our invention:

1. A potential measuring technique apparatus, comprising:
    an objective lens means for focusing primary electrons on an object;
    spectrometer secondary electron detection means for energy selection of secondary electrons;
    said objective lens means comprising a magnetic lens in which a magnetic field thereof lies primarily outside a body of the lens means;
    the spectrometer detection means comprising an electrostatic retarding field spectrometer detection means arranged in the magnetic field of the lens means; and
    the magnetic lens and spectrometer detection means being designed such that the magnetic field and an electric field of the spectrometer detection means run substantially in a same direction and with field lines parallel to one another.

2. An apparatus according to claim 1 wherein a source of the primary electrons is arranged on the field side of the magnetic lens means.

3. An apparatus according to claim 1 wherein a source of the primary electrons is arranged on a ferromagnetic circuit side of the magnetic lens means.

4. An apparatus according to claim 1 wherein the spectrometer detection means has a grid electrode as a collector electrode.

5. An apparatus according to claim 1 wherein the spectrometer detection means has a pinhole diaphragm as a collector electrode.

6. An apparatus according to claim 1 wherein the spectrometer detection means has a scintillator with a light conductor as a detector element.

7. An apparatus according to claim 1 wherein the spectrometer detection means has a channel plate as a detector element.

8. A potential measuring technique apparatus, comprising:
    objective lens means for focusing primary electrons on an object;
    spectrometer secondary electron detection means for energy selection of secondary electrons;
    said objective lens means comprising a magnetic lens in which a magnetic field thereof lies primarily outside a body of the lens means; and
    the spectrometer detection means comprising an electrostatic retarding field spectrometer detection means arranged in the magnetic field of the lens means such that the magnetic field and an electric field of the spectrometer detection means are substantially parallel with one another so that the electric field is substantially spatially superimposed on the magnetic lens field.

9. An apparatus according to claim 8 wherein the magnetic lens and spectrometer detection means are designed such that the magnetic field and an electric field of the spectrometer detection means run substantially in a same direction.

10. An apparatus according to claim 8 wherein the magnetic lens and spectrometer detection means are designed such that the magnetic field and an electric field of the spectrometer detection means run substantially in an opposite direction.

11. A potential measuring technique apparatus, comprising:
    an objective lens means for focusing primary electrons on an object;
    spectrometer secondary electron detection means for energy selection of secondary electrons;
    said objective lens means comprising a magnetic lens in which a magnetic field thereof lies primarily outside a body of the lens means;
    the spectrometer detection means comprising an electrostatic retarding field spectrometer detection means arranged in the magnetic field of the lens means; and
    the magnetic lens and spectrometer detection means being designed such that the magnetic field and an electric field of the spectrometer detection means run substantially in an opposite direction and with field lines parallel to one another.

* * * * *